United States Patent
Ichihara

(10) Patent No.: US 9,019,016 B2
(45) Date of Patent: Apr. 28, 2015

(54) ACCUMULATOR-TYPE FRACTIONAL N-PLL SYNTHESIZER AND CONTROL METHOD THEREOF

(75) Inventor: Eizo Ichihara, Tokyo (JP)

(73) Assignee: Asahi Kasei Microdevices Corporation, Tokyo (JP)

(*) Notice: Subject to any disclaimer, the term of this patent is extended or adjusted under 35 U.S.C. 154(b) by 97 days.

(21) Appl. No.: 13/701,955

(22) PCT Filed: May 11, 2012

(86) PCT No.: PCT/JP2012/003089
§ 371 (c)(1),
(2), (4) Date: Dec. 4, 2012

(87) PCT Pub. No.: WO2012/157234
PCT Pub. Date: Nov. 22, 2012

(65) Prior Publication Data
US 2013/0088300 A1    Apr. 11, 2013

(30) Foreign Application Priority Data
May 18, 2011    (JP) ................... 2011-111642

(51) Int. Cl.
*H03L 7/089* (2006.01)
*H03L 7/085* (2006.01)
*H03L 7/197* (2006.01)

(52) U.S. Cl.
CPC .............. *H03L 7/085* (2013.01); *H03L 7/089* (2013.01); *H03L 7/1976* (2013.01)

(58) Field of Classification Search
CPC ....... H03L 7/1976; H03L 7/08; H03L 7/0891; H03L 7/00; H03L 7/0994
USPC ............ 331/1 A, 16, 25; 327/156, 159, 158
See application file for complete search history.

(56) References Cited

U.S. PATENT DOCUMENTS

| 5,018,170 A | 5/1991 | Wilson |
| 5,818,303 A | 10/1998 | Oishi et al. |

(Continued)

FOREIGN PATENT DOCUMENTS

| GB | 2368207 A | 4/2002 |
| JP | 08-213905 | 8/1996 |

(Continued)

OTHER PUBLICATIONS

Written Opinion of the International Searching Authority dated Nov. 11, 2013, for International application No. PCT/JP2012/003089.

(Continued)

*Primary Examiner* — Arnold Kinkead
(74) *Attorney, Agent, or Firm* — Morgan, Lewis & Bockius LLP

(57) ABSTRACT

There are provided an accumulator-type fractional N-PLL synthesizer for suppressing the fractional spurious caused by periodically switching a frequency division number of a fractional frequency divider, and a control method thereof. In an accumulator-type fractional N-PLL synthesizer (100), a pulse signal proportional to a fractional phase error occurring between a reference signal and an output signal of a fractional divider (112) for feeding back an output of a VCO (115) of an output stage to a preceding stage is generated using an error signal from an accumulator (120). Through the use of the pulse signal, pulse widths of a UP signal and a DN signal output from a phase detector (140) are controlled so as to reduce a fractional phase error occurring between the UP signal and the DN signal. Thus, the fractional spurious caused by periodically switching the frequency division number of the fractional divider (112) is suppressed.

17 Claims, 15 Drawing Sheets

(56) References Cited

U.S. PATENT DOCUMENTS

| | | | |
|---|---|---|---|
| 6,130,561 A | 10/2000 | Dufour | |
| 6,317,476 B1 | 11/2001 | Oishi et al. | |
| 6,553,089 B2 | 4/2003 | Huh et al. | |
| 6,628,153 B2 | 9/2003 | Inoue | |
| 6,704,383 B2 | 3/2004 | Lee et al. | |
| 6,829,318 B2 | 12/2004 | Kawahara | |
| 7,327,820 B2 | 2/2008 | Meninger et al. | |
| 7,417,510 B2 | 8/2008 | Huang | |
| 7,817,768 B2 * | 10/2010 | Beyer et al. | 375/376 |
| 8,497,716 B2 * | 7/2013 | Zhang | 327/156 |
| 2002/0070780 A1 | 6/2002 | Inoue | |
| 2008/0048791 A1 | 2/2008 | Fahim | |

FOREIGN PATENT DOCUMENTS

| | | |
|---|---|---|
| JP | 10-154935 | 6/1998 |
| JP | 11-225072 | 8/1999 |
| JP | 2002-057579 | 2/2002 |
| JP | 2002-135116 | 5/2002 |
| JP | 2002-217723 | 8/2002 |
| JP | 2002-534832 | 10/2002 |
| JP | 2003-283334 | 10/2003 |
| JP | 2004-530334 | 9/2004 |

OTHER PUBLICATIONS

Meninger, A 1-MHZ Bandwidth 3.6-GHz 0.18-μm CMOS Fractional-N Synthesizer Utilizing a Hybrid PFD/DAC Structure for Reduced Broadband Phase Noise, IEEE Journal of Solid=State Circuits, vol. 41, No. 4, pp. 966-980, Apr. 2006.
International Search Report for International application No. PCT/JP2012/003089.
Japanese Office Action dated Nov. 26, 2013 for corresponding Japanese Patent Application No. 2012-544778.
Extended European Search Report dated Sep. 30, 2014, issued by the European Patent Office in Eruopean Patent Application No. 12785046.9.

* cited by examiner

EXAMPLE) FREQUENCY DIVISION BY 2.25 (FREQUENCY DIVISION BY 9/4)

| CYCLE | OVERFLOW SIGNAL | ERROR SIGNAL | FREQUENCY DIVISION NUMBER |
|---|---|---|---|
| 1 | 0 | 1/4 | 2 |
| 2 | 0 | 2/4 | 2 |
| 3 | 0 | 3/4 | 2 |
| 4 | 1 | 0 | 3 |
| 5 | 0 | 1/4 | 2 |
| 6 | 0 | 2/4 | 2 |
| 7 | 0 | 3/4 | 2 |
| 8 | 1 | 0 | 3 |
| 9 | 0 | 1/4 | 2 |

PHASE DIFFERENCE DETECTION CIRCUIT 146

FREQUENCY AND PHASE DETECTOR 141a

FIG. 15
FRACTIONAL PHASE ERROR PULSE GENERATION CIRCUIT 142a
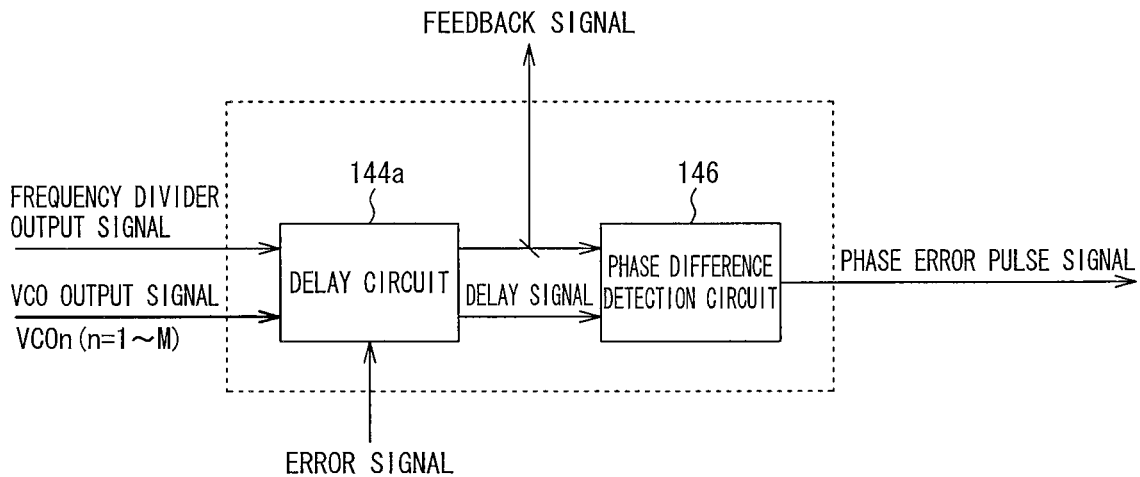
FIG. 16
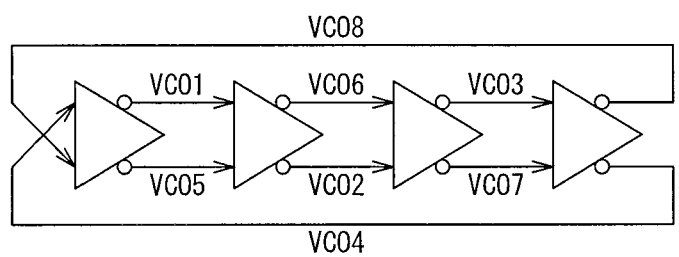
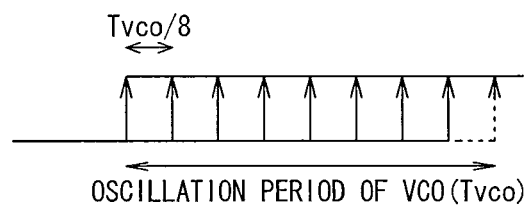

PHASE DIFFERENCE DETECTION CIRCUIT 146b

FRACTIONAL PHASE ERROR REMOVAL CIRCUIT 143b

PRIOR ART

ACCUMULATOR-TYPE FRACTIONAL N-PLL SYNTHESIZER AND CONTROL METHOD THEREOF

TECHNICAL FIELD

The present invention relates to fractional N-PLL synthesizers, more particularly to an accumulator-type fractional N-PLL synthesizer for controlling a fractional frequency division number using an accumulator and a control method thereof.

BACKGROUND ART

A fractional N-PLL synthesizer is a PLL characterized in that a feedback frequency division number for frequency-dividing an output of a voltage-controlled oscillator (hereafter, VCO) is a fractional frequency division number. FIG. 23 illustrates an example of a typical fractional N-PLL synthesizer.

In FIG. 23, a fractional N-PLL synthesizer 1700 includes: a phase detector 1711 for detecting a phase difference between a reference signal and a feedback signal; a charge pump 1713 of the next stage; a low-pass filter (hereafter, LPF) 1714 of the further next stage; a VCO 1715 of the next stage; a fractional frequency divider 1712 for frequency-dividing an output of the VCO 1715; and a delta-sigma modulator 1720, and is referred to as a delta-sigma-type fractional N-PLL synthesizer.

The phase detector 1711 detects the phase difference between the reference signal and the feedback signal output from the fractional frequency divider 1712, and outputs the detected phase difference to the charge pump 1713. The charge pump 1713 outputs an amount of charge corresponding to the phase difference, to the LPF 1714.

The VCO 1715 changes an output frequency according to an output of the LPF 1714. The fractional frequency divider 1712 divides an output signal of the VCO 1715 by a predetermined division ratio, and outputs the divided signal to the phase detector 1711.

The delta-sigma modulator 1720 temporally switches the frequency division number in the fractional frequency divider 1712 between frequency division by N and frequency division (N+1), according to a set value of a numerator and a denominator of a feedback frequency division number.

For example, let Fref be a frequency of the reference signal, and N+NUM/DEN (where N, NUM, and DEN are each an integer) be the feedback frequency division number. An oscillation frequency $F_{VCO}$ of the output signal of the VCO 1715 is expressed as $$F_{VCO} = Fref \times (N+NUM/DEN) \quad (1)$$

Transforming Expression (1) yields $$F_{VCO} = Fref \times \{(NUM/DEN) \times (N+1) + (1-NUM/DEN) \times N\} \quad (2)$$

By switching the frequency division number between frequency division by N and frequency division by (N+1) in a time proportion according to Expression (2), the fractional frequency divider 1712 realizes a fractional frequency division number.

Moreover, the feedback frequency division number is aperiodically switched through the use of delta-sigma modulation. This produces an advantage that fractional spurious which is inherent spurious corresponding to switching periodicity is unlikely to occur.

However, in the system described above with reference to FIG. 23, the fractional spurious is noise-shaped toward higher frequencies by the delta-sigma modulator 1720, and so the noise component needs to be removed in the LPF 1714 constituting the PLL. Thus, the delta-sigma-type fractional N-PLL synthesizer has a problem that a lower cutoff frequency of the LPF is needed.

Here, the PLL has a function as a low-pass filter, but, when viewed from the LPF and the VCO which are elements of the PLL, functions as a high-pass filter (hereafter, HPF). Accordingly, low-frequency noise component generated from the elements such as the LPF and the VCO is removed by the function of the PLL as a low-pass filter. Low-frequency noise component can be removed more efficiently when the cutoff frequency of the low-pass filter as the function of the PLL is higher.

Due to the above-mentioned circumstances, the delta-sigma-type fractional N-PLL synthesizer cannot sufficiently remove low-frequency noise generated from the LPF and the VCO constituting the PLL, resulting in that a problem of degradation in output signal performance (jitter) of fractional N-PLL synthesizers still remains.

FIG. 24 is a diagram illustrating a fractional N-PLL synthesizer according to a system that uses an accumulator, as another conventional example different from that in FIG. 23.

In FIG. 24, a fractional N-PLL synthesizer 1800 includes: a phase detector 1811 for detecting a phase difference between a reference signal and a feedback signal; a charge pump 1813 of the next stage; a low-pass filter (hereafter, LPF) 1814 of the further next stage; a VCO 1815 of the next stage; a fractional frequency divider 1812 for frequency-dividing an output of the VCO 1815; and an accumulator 1820 for periodically switching the frequency division number of the fractional frequency divider 1812, and is referred to as an accumulator-type fractional N-PLL.

The accumulator-type fractional N-PLL employs a system of realizing a fractional frequency division number by periodically switching the frequency division number of the fractional frequency divider 1812 according to an output of the accumulator 1820. In this system, there is no need to remove high-frequency noise because the delta-sigma modulator as in the system in FIG. 23 is not included, and therefore the cutoff frequency of the low-pass filter can be set higher. The system is thus excellent in that low-frequency noise generated from the LPF and the VCO constituting the PLL can be sufficiently removed to achieve improved output signal performance (jitter).

PRIOR ART DOCUMENT

Non-Patent Document

Non-Patent Document 1: S. E. Meninger and M. H. Perrott, "A 1 MHz Bandwidth 3.6-GHz 0.18 μm CMOS Fractional-N Synthesizer Utilizing a Hybrid PFD/DAC structure for Reduced Broadband Phase Noise," IEEE J. Solid-state Circuits, vol. 41, pp. 966-980, April 2006.

SUMMARY OF THE INVENTION

Problem to be Solved

However, the conventional accumulator-type fractional N-PLL synthesizer described with reference to FIG. 24 has the following problem. Since the frequency division number of the fractional frequency divider is periodically switched, a periodic phase error (hereafter, fractional phase error) occurs between the reference signal and the feedback signal even when locked, which causes the fractional spurious corresponding to switching periodicity.

The present invention has been made in view of the above-mentioned circumstances, and has an object of providing an accumulator-type fractional N-PLL synthesizer with less fractional spurious, and a control method thereof.

Solution to the Problem

To solve the problems stated above, the following techniques are proposed.

(1) According to an aspect of the present invention, there is provided an accumulator-type fractional N-PLL synthesizer including: a VCO; a fractional frequency divider disposed in a feedback path of an output signal of the VCO, for generating a frequency divider output signal of a fractional frequency division number; an accumulator for supplying an overflow signal for periodically switching the frequency division number of the fractional frequency division number, to the fractional frequency divider; and a phase detector for detecting a phase difference between the frequency divider output signal and a predetermined reference signal to generate a control input signal to the VCO based on the detected phase difference, wherein the accumulator generates an error signal having fractional phase error information, and wherein the phase detector corrects the phase difference between the frequency divider output signal and the reference signal, using the error signal.

(2) The phase detector may generate the phase difference as a UP signal and a DN signal, and supply the generated UP signal and DN signal to a charge pump for generating the control input signal.

(3) The phase detector may include: a fractional phase error pulse generation circuit for generating a phase error pulse signal having a pulse width proportional to a fractional phase error and generating a feedback signal, based on the frequency divider output signal and the error signal;

a frequency and phase detector for generating a frequency and phase detection output signal having a pulse width proportional to a difference in frequency and phase between the reference signal and the feedback signal; and a fractional phase error removal circuit for generating the UP signal and the DN signal with the fractional phase error included in the frequency and phase detection output signal being reduced based on the phase error pulse signal.

(4) The fractional phase error removal circuit may include a logical circuit for taking a logical sum of the frequency and phase detection output signal and the phase error pulse signal.

(5) The fractional phase error removal circuit may include a logical circuit including a NOT circuit and a NOR circuit for removing the fractional phase error included in the frequency and phase detection output signal using the phase error pulse signal.

(6) The fractional phase error removal circuit may remove the fractional phase error occurring between two output signals which are a UPX signal and a DNX signal included in the frequency and phase detection output signal, by performing logical operations of

*UP* signal=*UPX* signal+(*DNX_N* signal·*DNC* signal), and

*DN* signal=*UPC* signal+(*DNC_N* signal·*DNX* signal), using the phase error pulse signal including a UPC signal and a DNC signal, where the DNX_N signal is an inversion signal of the DNX signal, and the DNC_N signal is an inversion signal of the DNC signal.

(7) The fractional phase error pulse generation circuit may include:

a delay circuit for generating the feedback signal and a delay signal having a predetermined time delay with respect to the feedback signal, based on the frequency divider output signal;

a phase shift circuit for generating a phase adjustment signal based on the feedback signal, the delay signal, and the error signal; and a phase difference detection circuit for generating the phase error pulse signal having a pulse width proportional to a phase difference between the feedback signal and the phase adjustment signal.

(8) The fractional phase error pulse generation circuit may include:

a delay circuit for generating the feedback signal and a delay signal that has a predetermined time delay with respect to the feedback signal, based on the frequency divider output signal;

a phase shift circuit for generating a phase adjustment signal based on the feedback signal, the delay signal, and the error signal; and a phase difference detection circuit for generating a UPC signal and a DNC signal as the phase error pulse signal having a pulse width proportional to a phase difference between the feedback signal and the phase adjustment signal.

(9) The delay circuit may generate the feedback signal and the delay signal to be delayed by a period of the output signal with respect to the feedback signal, based on an input signal to the delay circuit.

(10) The phase shift circuit may be supplied with the feedback signal and the delay signal, and generate the phase adjustment signal by performing phase shift on the feedback signal based on the error signal.

(11) The fractional phase error pulse generation circuit may include: a delay circuit for generating a delay signal delayed by an integer multiple of 1/M of an output period of the VCO with respect to the feedback signal where M is a natural number, based on the error signal; and a phase difference detection circuit for generating the phase error pulse signal having a pulse width proportional to a phase difference between the feedback signal and the delay signal.

(12) The delay circuit may select one signal out of the frequency divider output signal and a plurality of signals each delayed by an integer multiple of 1/M of an output period of the VCO where M is a natural number, based on the error signal.

(13) The error signal may be a signal that gradually changes in each period of the overflow signal.

(14) According to another aspect of the present invention, there is provided an accumulator-type fractional N-PLL synthesizer including: an accumulator; and a phase detector for generating a UP signal and a DN signal with a fractional phase error which occurs between a reference signal and a frequency divider output signal being reduced based on an error signal from the accumulator.

(15) According to still another aspect of the present invention, there is provided a control method of an accumulator-type fractional N-PLL synthesizer, for controlling a phase detector to generate a UP signal and a DN signal with a fractional phase error which occurs between a reference signal and a frequency divider output signal being reduced based on an error signal from an accumulator.

Advantageous Effects of the Invention

According to the present invention, it is possible to realize an accumulator-type fractional N-PLL synthesizer with less fractional spurious.

BRIEF DESCRIPTION OF THE DRAWINGS

FIG. 15 is a block diagram illustrating an example of a fractional phase error pulse generation circuit applied to the phase detector in FIG. 4;

FIG. 16 is a block diagram illustrating a VCO for obtaining eight VCO output signals delayed by an integer multiple of 1/8 of an output period of the VCO;

DESCRIPTION OF EMBODIMENTS

Embodiments of the present invention will now be described in detail to demonstrate the present invention.

Figure 1:
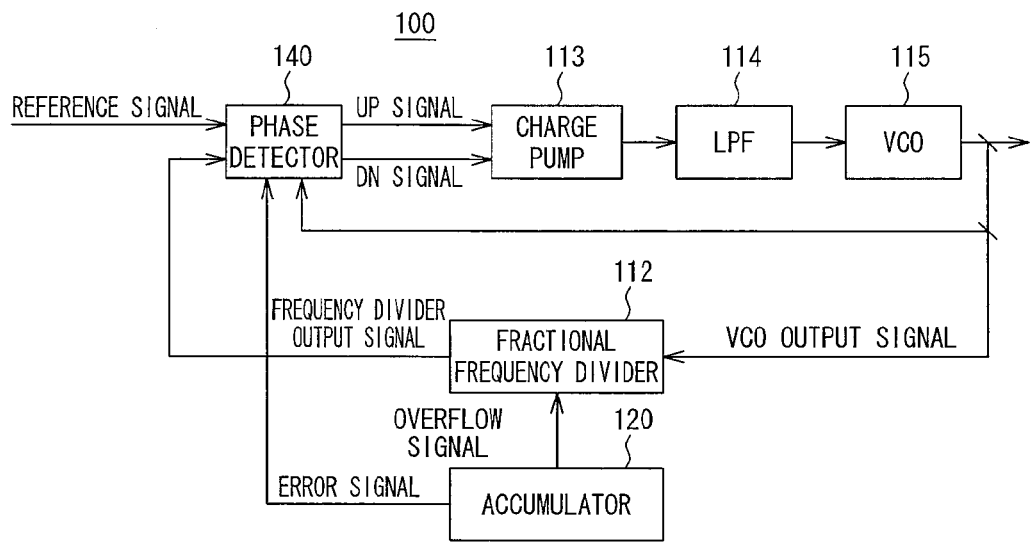
FIG. 1 is a block diagram illustrating an accumulator-type fractional N-PLL synthesizer, according to an embodiment of the present invention.

FIG. 1 is a block diagram illustrating an accumulator-type fractional N-PLL synthesizer, according to an embodiment of the present invention.

Figure 24:
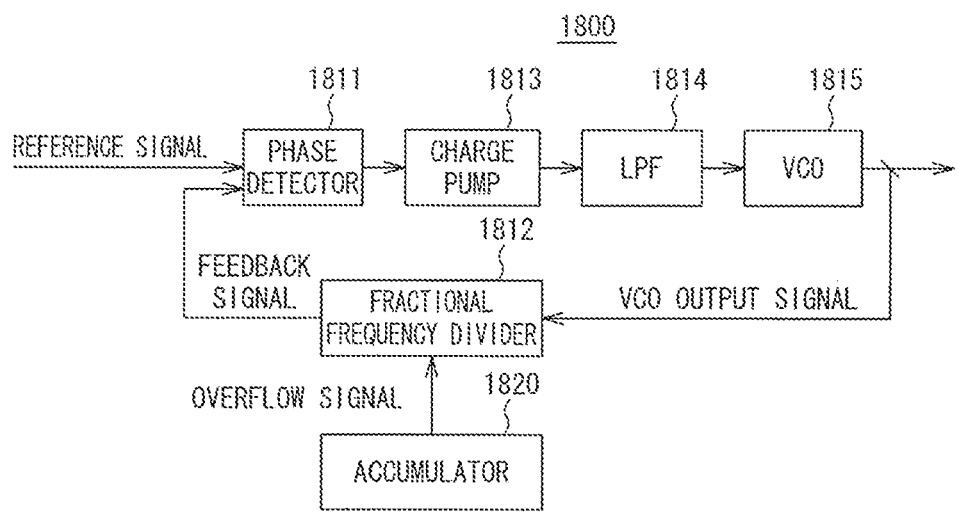
FIG. 24 is a block diagram illustrating a conventional accumulator-type fractional N-PLL synthesizer.

In FIG. 1, an accumulator-type fractional N-PLL synthesizer 100 includes: a phase detector 140 for detecting a phase difference between a reference signal and a feedback signal; a charge pump 113 of the next stage; an LPF 114 of the further next stage; a VCO 115 of the next stage; a fractional frequency divider 112 for frequency-dividing an output of the VCO 115; and an accumulator 120. These elements in the above-described order correspond respectively to the phase detector 1811, the charge pump 1813, the LPF 1814, the VCO 1815, the fractional frequency divider 1812, and the accumulator 1820 in the fractional N-PLL synthesizer 1800 described above with reference to FIG. 24.

The accumulator-type fractional N-PLL synthesizer 100 is the same as the accumulator-type fractional N-PLL synthesizer 1800 described above with reference to FIG. 24 in that a frequency division number of the fractional frequency divider 112 disposed in a feedback path of the VCO 115 is periodically switched according to an overflow signal generated by the accumulator 120 to thereby obtain a feedback signal of a fractional frequency division number, a phase difference between the feedback signal and a predetermined reference signal is detected by the phase detector, and a control input signal for the VCO is generated based on the detected phase difference.

The accumulator-type fractional N-PLL synthesizer 100 in this embodiment has a feature that an error signal from the accumulator 120 and a VCO output signal from the VCO 115 are input to the phase detector 140, as will be described in detail later.

Next, a description will be give of the accumulator 120, the fractional frequency divider 112, and the phase detector 140 in the accumulator-type fractional N-PLL synthesizer 100, with reference to drawings.

Figure 2:
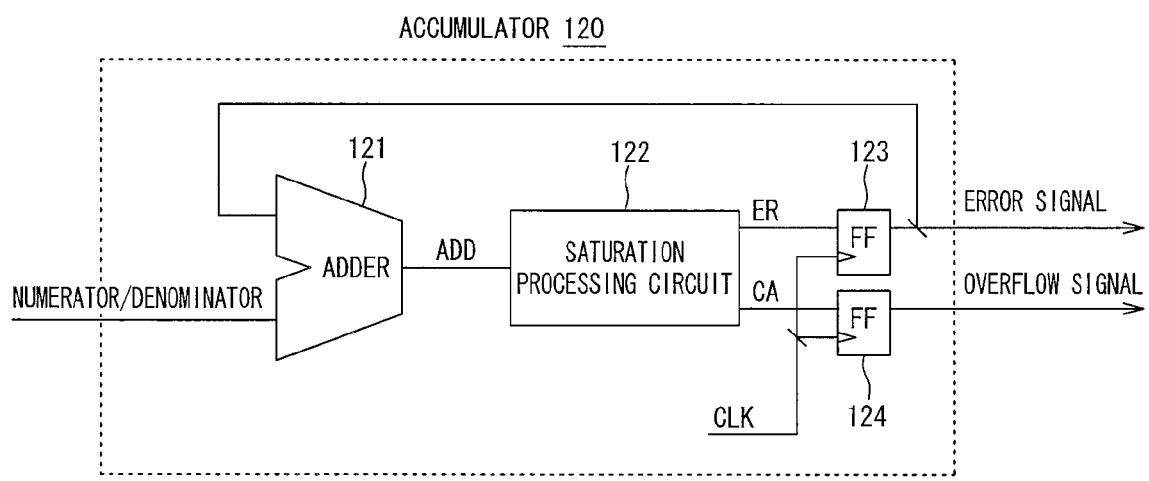
FIG. 2 is a block diagram illustrating an accumulator applied to the accumulator-type fractional N-PLL synthesizer in FIG. 1.

FIG. 2 is a block diagram illustrating the accumulator 120 applied to the accumulator-type fractional N-PLL synthesizer 100 in FIG. 1.

In FIG. 2, the accumulator 120 adds a fractional value expressed as "numerator/denominator" and the error signal together, using an adder 121. A saturation processing circuit 122 of the next stage of the adder 121 determines whether an addition signal ADD is more or less than 1. In a case where the addition signal ADD is less than 1, one output ER of the saturation processing circuit 122 is set such that ER=ADD, and the other output CA of the saturation processing circuit 122 is set such that CA=0. In a case where the addition signal ADD is equal to or more than 1, on the other hand, the output ER of the saturation processing circuit 122 is set such that ER=ADD−1 and the other output CA of the saturation processing circuit 122 is set such that CA=1.

The output ER of the saturation processing circuit 122 is input to a flip-flop (FF) 123, and the other output CA of the saturation processing circuit 122 is input to a flip-flop (FF) 124. A clock signal CLK is input to each of the flip-flops 123 and 124. The flip-flop 123 outputs the output ER of the saturation processing circuit 122 as an error signal, in synchronization with the clock signal CLK. Likewise, the flip-flop 124 outputs the other output CA of the saturation processing circuit 123 as an overflow signal, in synchronization with the clock signal CLK.

Figures 3, 4:
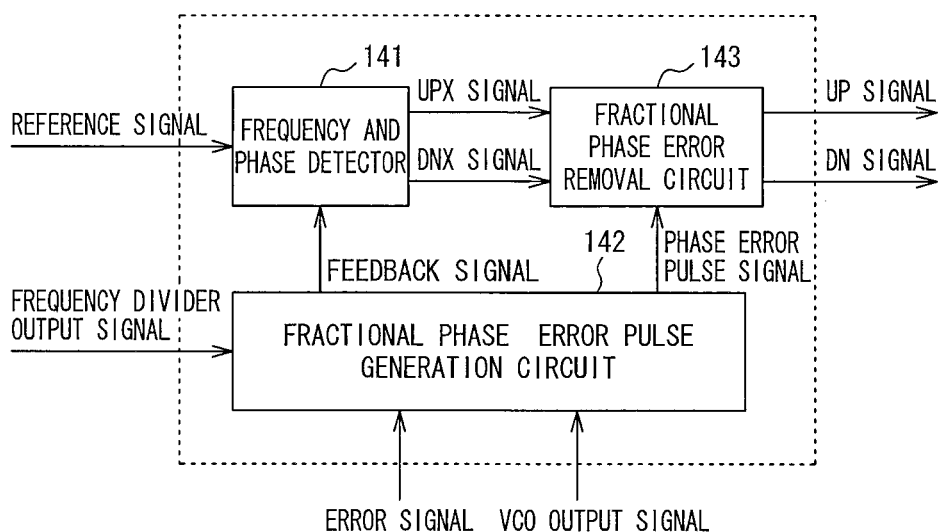
FIG. 3 is a diagram illustrating the output of the accumulator in FIG. 2 for each period in a time series in a case where a fractional frequency division set value is 9/4.
FIG. 4 is a block diagram illustrating a phase detector applied to the accumulator-type fractional N-PLL synthesizer in FIG. 1.

FIG. 3 is a diagram illustrating the output of the accumulator 120 in FIG. 2 for each period in a time series manner in a case where the input signal (numerator/denominator) to the accumulator 120 is 9/4. That is, time cycles of each signal output from the accumulator 120 are listed in FIG. 3. As can be easily understood from FIG. 3, the overflow signal is output periodically as 00010001 . . . . This switches the frequency division number of the fractional frequency divider as 22232223 . . . , thus generating four clock edges while counting nine input clock edges. The fractional frequency division by 9/4 is achieved in this way. Meanwhile, pre-overflow accumulation information is output from the accumulator 120 as 1/4, 2/4, 3/4, 0, 1/4, 2/4, 3/4, 0 . . . , as the error signal. The value of the error signal mentioned above represents the period of the output signal of the VCO 115, as a unit value.

The above-mentioned error signal is not a difference (deviation) between the result of the accumulation process in the accumulator 120 and some kind of reference value, but a phase adjustment signal whose value is used for performing phase adjustment on a signal to be adjusted. This value, however, corresponds to a deviation between the signal to be phase-adjusted and the reference signal that serves as the reference, as will be described later.

As can be understood from above description, the accumulator 120 is configured to: generate the error signal for phase adjustment that cyclically changes in the output period of the VCO 115 while gradually changing in its accumulation value at each time interval obtained by dividing the period of the output signal of the VCO 115 by a predetermined natural number, and supply the error signal to the phase detector 140; and also generate the overflow signal described with reference to FIG. 3 each time the accumulation value reaches a predetermined saturation value, and supply the overflow signal to the fractional frequency divider 112.

FIG. 4 is a block diagram illustrating the phase detector 140 applied to the accumulator-type fractional N-PLL synthesizer 100 in FIG. 1.

The phase detector 140 in FIG. 4 is formed by connecting a frequency and phase detector 141, a fractional phase error pulse generation circuit 142, and a fractional phase error removal circuit 143, as illustrated.

The phase detector 140 is configured to correct and detect the phase difference between the frequency divider output signal supplied from the fractional frequency divider 112 as a feedback signal and a predetermined reference signal by reflecting the error signal supplied from the accumulator 120 and the output signal of the VCO 115 so as to reduce a fractional phase error. The structure and operation of the phase detector 140 will be described in more detail later with reference to drawings.

The fractional phase error pulse generation circuit 142 generates the feedback signal to the frequency and phase detector 141, and a phase error pulse signal that is proportional to the fractional phase error and that is supplied to the fractional phase error removal circuit 143, based on the frequency divider output signal from the fractional frequency divider 112, the VCO output signal from the VCO 115, and the error signal from the accumulator 120.

The frequency and phase detector 141 compares frequencies and phases between a predetermined reference signal and the feedback signal from the fractional phase error pulse generation circuit 142, and generates a UPX signal and a DNX signal corresponding to differences as a result of comparison. The fractional phase error is included between the UPX signal and the DNX signal.

The fractional phase error removal circuit 143 controls pulse widths of the UPX signal and the DNX signal including the fractional phase error from the frequency and phase detector 141 based on the phase error pulse signal from the fractional phase error pulse generation circuit 142, thereby obtaining a UP signal and a DN signal with the reduced fractional phase error. The fractional phase error removal circuit 143 then supplies the obtained UP signal and DN signal to the charge pump 113 (FIG. 1).

The phase detector 140 in the accumulator-type fractional N-PLL synthesizer 100 in FIG. 1 will be further described below, with reference to FIG. 5.

Figure 5:
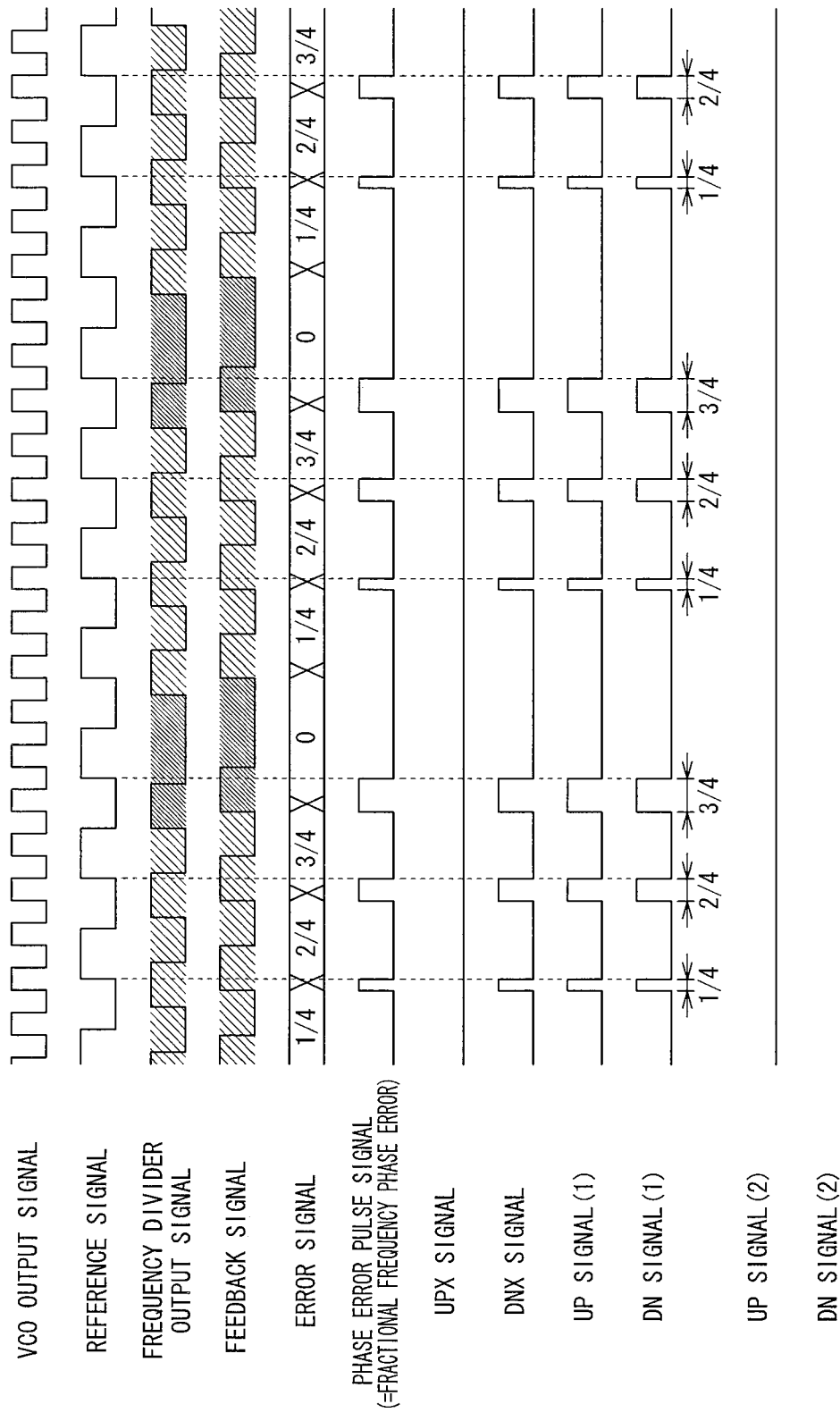
FIG. 5 is an exemplary timing chart illustrating each signal related to input and output of the phase detector in a case where the fractional frequency division set value is 9/4, in the accumulator-type fractional N-PLL synthesizer in FIG. 1.

FIG. 5 is a timing chart illustrating each signal related to input and output of the phase detector 140 in the case where the fractional frequency division is set to 9/4, when the phase detector 140 described above with reference to FIG. 4 is applied as the phase detector 140 in the accumulator-type fractional N-PLL synthesizer 100 in FIG. 1.

As can be understood from FIG. 5, in the accumulator-type fractional N-PLL synthesizer 100, a periodic phase error (fractional phase error) occurs between the reference signal and the feedback signal, and then a pulse signal is output only in the DNX signal of the two outputs from the frequency and phase detector 141. This propagates to the LPF 114, thus causing the fractional spurious.

As can be easily understood by comparing FIG. 5 with FIG. 3 described above, the error signal of the accumulator 120 serves as fractional phase error information. That is, the fractional phase error is 1/4, 2/4, 3/4, 0, 1/4, 2/4, 3/4, 0 . . . , when the output period of the VCO 115 is set as a unit. By use of the fact that the error signal from the accumulator 120 carries the fractional phase error information, the fractional phase error pulse generation circuit 142 generates the phase error pulse signal proportional to the fractional phase error as described above.

The fractional phase error removal circuit 143 can use a method of outputting logical addition results of the phase error pulse signal to both the UPX signal and the DNX signal to the charge pump 113 respectively as a UP signal and a DN signal, and a method of outputting logical subtraction results of the phase error pulse signal from both the UPX signal and the DNX signal to the charge pump 113 respectively as the UP signal and the DN signal.

In the former method of taking the logical sum, the UP signal and the DN signal output to the charge pump 113 have the same pulse width with respect to the fractional phase error in a state where the fractional N-PLL synthesizer 100 is locked (see UP signal (1) and DN signal (1) in FIG. 5). Accordingly, no charge is output from the charge pump 113 to the LPF 114 in the locked state, so that the input voltage of the VCO 115 does not vary periodically.

In the latter method of taking the logical difference, the fractional phase error is not included in any of the UP signal and the DN signal output to the charge pump 113 in a state where the fractional N-PLL synthesizer 100 is locked (see UP signal (2) and DN signal (2) in FIG. 5). In this case, too, no charge is output from the charge pump 113 to the LPF 114 in the locked state, so that the input voltage of the VCO 115 does not vary periodically.

In the above-mentioned manner, the problem of the fractional spurious in the conventional accumulator-type fractional N-PLL described above with reference to FIG. 24 can be significantly reduced.

When compared with another technique in which the periodic charge output from the charge pump causing the fractional spurious is canceled out by the output of another charge pump newly provided, the accumulator-type fractional N-PLL synthesizer in this embodiment does not need another charge pump circuit, and so does not have any problem of consistency in the current amount or operation timing between two charge pumps. Hence, the accumulator-type fractional N-PLL synthesizer in this embodiment produces a more prominent advantageous effect of reducing the fractional spurious.

Figure 23:
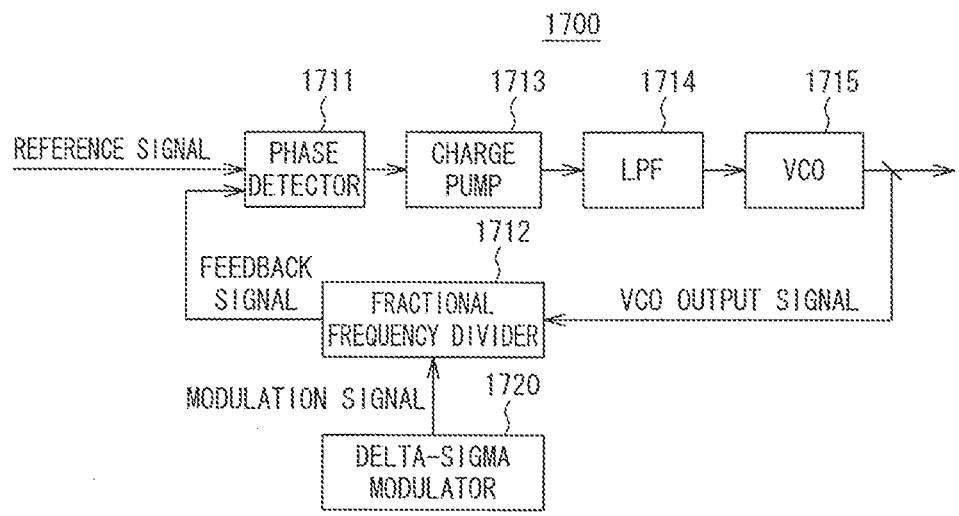
FIG. 23 is a block diagram illustrating a typical delta-sigma-type fractional N-PLL synthesizer.

Moreover, when compared with the delta-sigma-type fractional N-PLL synthesizer described above with reference to FIG. 23, the embodiment illustrated in FIG. 1 is characterized by intending to reduce the fractional spurious itself. This eliminates the need for a lower LPF cutoff frequency needed for the delta-sigma-type fractional N-PLL synthesizer. Therefore, low-frequency noise component generated from the elements constituting the LPF and the VCO can be efficiently removed, which contributes to improved output signal performance (jitter) of the fractional N-PLL synthesizer.

Furthermore, the typical delta-sigma-type fractional N-PLL synthesizer has a problem that the denominator in fractional frequency division needs to be a fixed value and an arbitrary frequency cannot be generated without causing a frequency error. This embodiment, on the other hand, is also characterized by employing the accumulator-type fractional N-PLL synthesizer system, and therefore exhibits an excellent feature that an arbitrary frequency can be generated without causing a frequency error.

Figure 6:
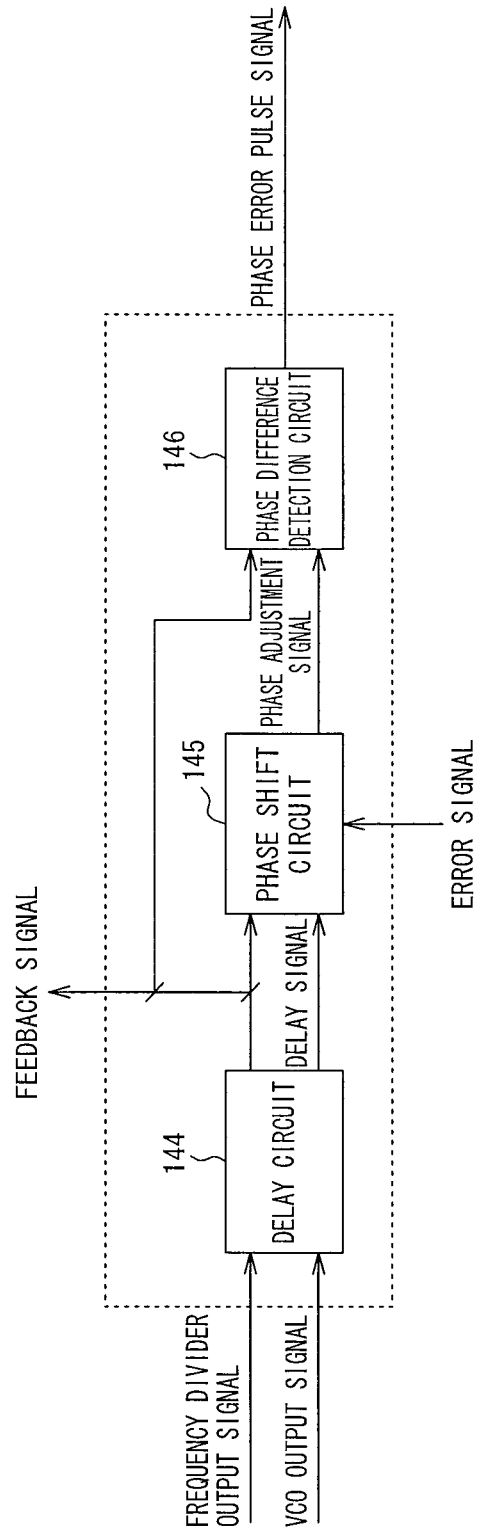
FIG. 6 is a block diagram illustrating an example of a fractional phase error pulse generation circuit applied to the phase detector in FIG. 4.

FIG. 6 is a block diagram illustrating an example of the fractional phase error pulse generation circuit 142 applied to the phase detector 140 in FIG. 4.

The fractional phase error pulse generation circuit 142 in FIG. 6 is formed by connecting a delay circuit 144, a phase shift circuit 145, and a phase difference detection circuit 146, as illustrated. The delay circuit 144 outputs a delay signal by providing a certain amount of delay to the input frequency divider output signal with respect to the feedback signal. A phase difference between the feedback signal and the delay signal is desirably a fixed value. Since the output signal from the VCO 115 is frequency-divided by N or N+1 by the fractional frequency divider 112, the phase difference between the feedback signal and the delay signal even at its maximum does not exceed the oscillation period of the VCO 115 as in FIG. 5 described above. However, it is more desirable that the phase difference between the delay signal and the reference signal be equal to the oscillation period of the VCO 115.

Though a dual-modulus frequency divider for performing frequency division by N or frequency division by (N+1) is used as an example of the above-mentioned fractional frequency divider 112, the present invention is not limited to this example, and may employ various specifications such as frequency division by N and frequency division by (N+2). In a case of employing the specifications of frequency division by N and frequency division by (N+2), it is more desirable that the phase difference between the delay signal and the reference signal be equal to twice the oscillation period of the VCO 115.

The phase shift circuit 145 provided in the next stage of the above-mentioned delay circuit 144 in the fractional phase error pulse generation circuit 142 in FIG. 6 generates a phase adjustment signal as an output signal, based on the delay signal and the feedback signal output from the delay circuit 144 and the error signal supplied from the accumulator 120.

The phase difference detection circuit 146 provided in the next stage of the above-mentioned delay circuit 144 and phase shift circuit 145 in the fractional phase error pulse generation circuit 142 in FIG. 6 generate the phase error pulse signal whose pulse width corresponds to a phase difference between rising edges of the feedback signal and the phase adjustment signal which are both input to the phase difference detection circuit 146.

Figure 7:
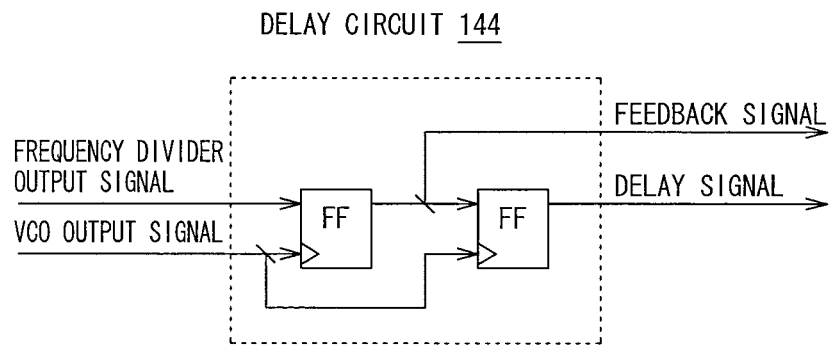
FIG. 7 is a circuit diagram illustrating a delay circuit applied to the fractional phase error pulse generation circuit in FIG. 6.

FIG. 7 is a circuit diagram illustrating the delay circuit 144 applied to the fractional phase error pulse generation circuit 142 in FIG. 6.

The delay circuit 144 in FIG. 7 enables the generation of the delay signal delayed by the oscillation period of the VCO 115 with respect to the feedback signal. Note that the structure of the delay circuit is not limited to that illustrated in FIG. 7.

Figure 8:
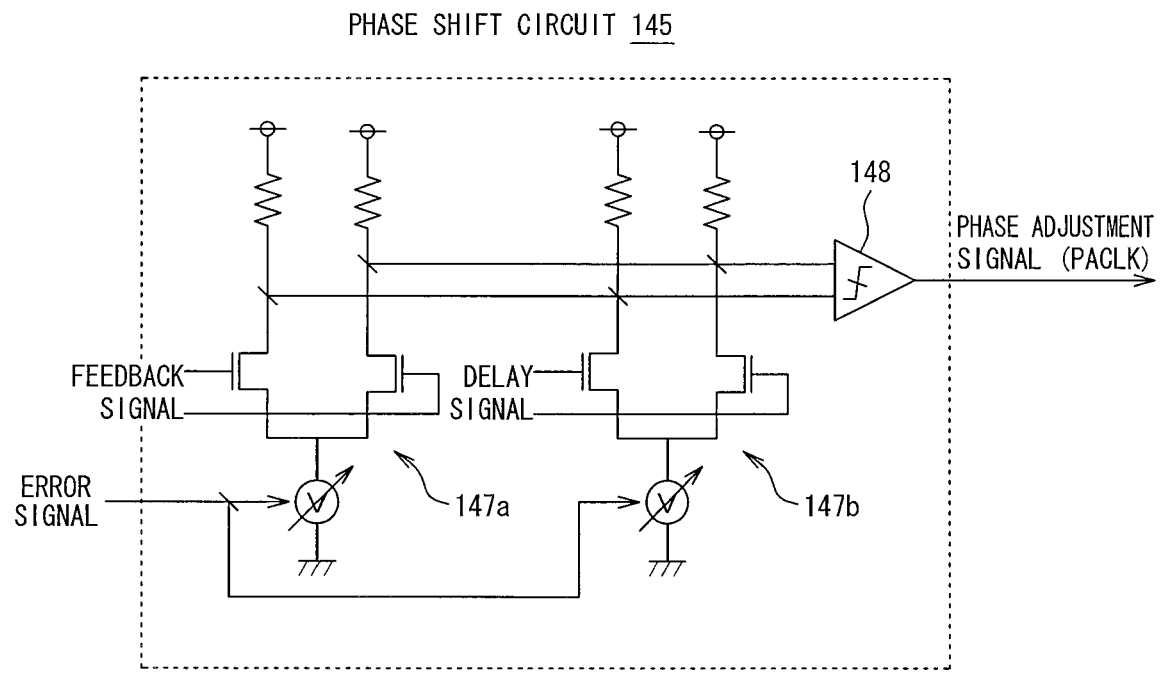
FIG. 8 is a circuit diagram illustrating a phase shift circuit applied to the fractional phase error pulse generation circuit in FIG. 6.

FIG. 8 is a circuit diagram illustrating the phase shift circuit 145 applied to the fractional phase error pulse generation circuit 142 in FIG. 6.

The phase shift circuit 145 in FIG. 8 is configured with a comparator 148 and two transconductance amplifiers (147a and 147b) whose transconductance values are variable according to current. The feedback signal and the delay signal are converted to differential signals of CML (current mode logic) beforehand. Each transconductance value is controlled based on the error signal. For example, in a case where the error signal is 1/4 as mentioned above, a desired phase shift amount can be obtained by setting a ratio of the transconductance values on the feedback signal side and the delay signal side to 1:3. Note that the structure of the phase shift circuit 145 is not limited to that illustrated in FIG. 8.

Figure 9:
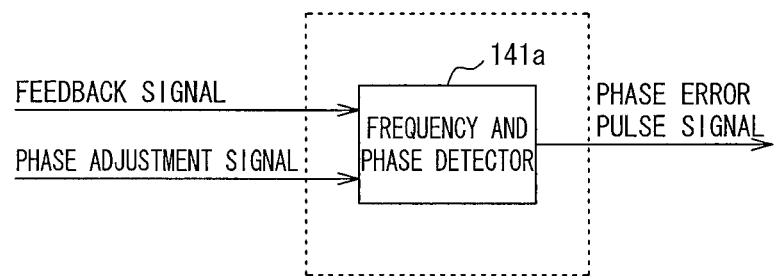
FIG. 9 is a block diagram illustrating a phase difference detection circuit applied to the fractional phase error pulse generation circuit in FIG. 6.

FIG. 9 is a block diagram illustrating the phase difference detection circuit 146 applied to the fractional phase error pulse generation circuit 142 in FIG. 6. The phase difference detection circuit 146 in FIG. 9 applies a frequency and phase detector 141a included in the phase detector 140 in FIG. 4. Note that the structure of the phase difference detection circuit is not limited to that illustrated in FIG. 9.

Figure 10:
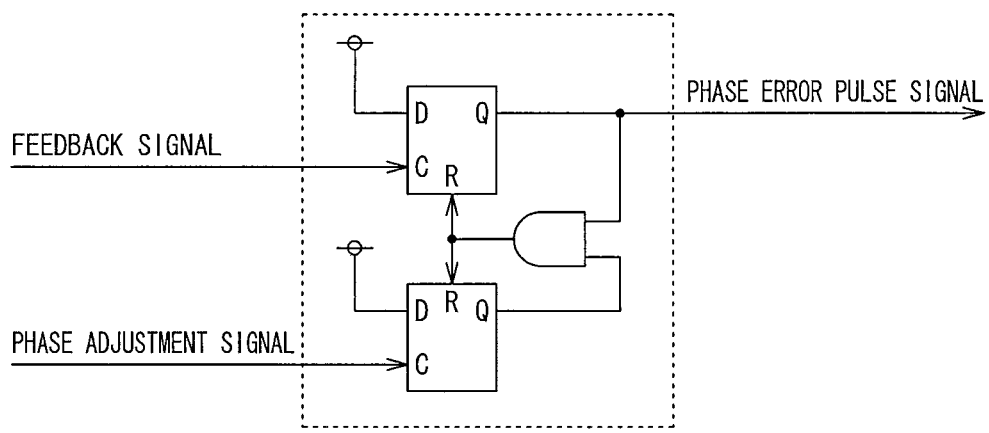
FIG. 10 is a circuit diagram illustrating a frequency and phase detector applied to the phase difference detection circuit in FIG. 9.

FIG. 10 is a circuit diagram illustrating the frequency and phase detector 141a applied to the phase difference detection circuit 146 in FIG. 9.

The frequency and phase detector 141a in FIG. 10 is formed by connecting two flip-flops and an AND circuit, as illustrated. This structure enables the generation of the phase error pulse signal whose pulse width corresponds to the phase difference between the rising edges of the reference signal and the feedback signal which are both input to the frequency and phase detector 141a. Note that the structure of the frequency and phase detector 141a is not limited to that illustrated in FIG. 10.

Figure 11:
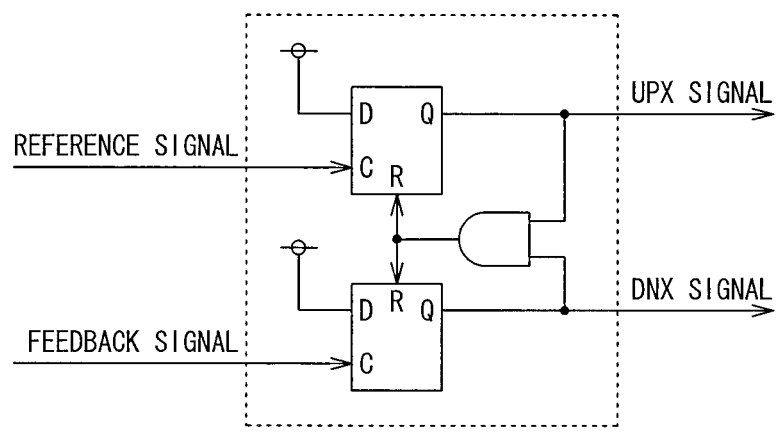
FIG. 11 is a circuit diagram illustrating a frequency and phase detector applied to the phase detector in FIG. 4.

FIG. 11 is a circuit diagram illustrating the frequency and phase detector 141 applied to the phase detector 140 in FIG. 4.

The frequency and phase detector 141 in FIG. 11 is formed by connecting two flip-flops and an AND circuit, as illustrated. This structure enables the generation of the phase error pulse signal whose pulse width corresponds to the phase difference between the rising edges of the reference signal and the feedback signal which are both input to the frequency and phase detector 141. Note that the structure of the frequency and phase detector 141 is not limited to that illustrated in FIG. 11.

Figure 12:
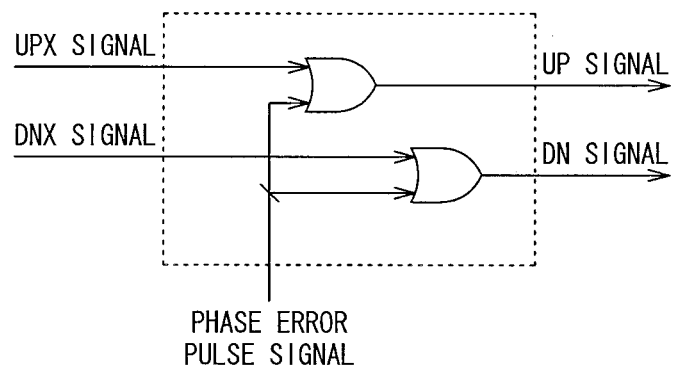
FIG. 12 is a circuit diagram illustrating an example of a fractional phase error removal circuit applied to the phase detector in FIG. 4.

FIG. 12 is a circuit diagram illustrating an example of the fractional phase error removal circuit 143 applied to the phase detector 140 in FIG. 4. The fractional phase error removal circuit 143 outputs the results of logical addition of the phase error pulse signal from the fractional phase error pulse generation circuit 142 to both the UPX signal and the DNX signal output from the frequency and phase detector 141, as the UP signal and the DN signal.

Figure 13:
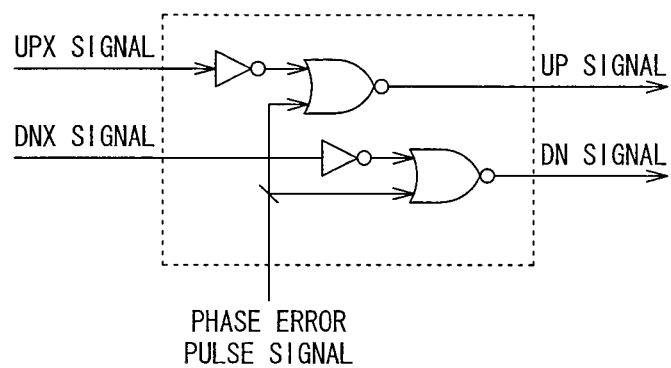
FIG. 13 is a circuit diagram illustrating an example of a fractional phase error removal circuit applied to the phase detector in FIG. 4.

FIG. 13 is a circuit diagram illustrating another example of the fractional phase error removal circuit 143 applied to the phase detector 140 in FIG. 4. The fractional phase error removal circuit 143 obtains the UP signal and the DN signal, by logical subtraction of the phase error pulse signal supplied from the fractional phase error pulse generation circuit 142, from both the UPX signal and the DNX signal output from the frequency and phase detector 141 in FIG. 11. Note that the structure of the fractional phase error removal circuit 143 is not limited to those illustrated in FIGS. 12 and 13.

The fractional phase error pulse generation circuit 142 will be further described below, with reference to FIGS. 6 and 14.

Figure 14:
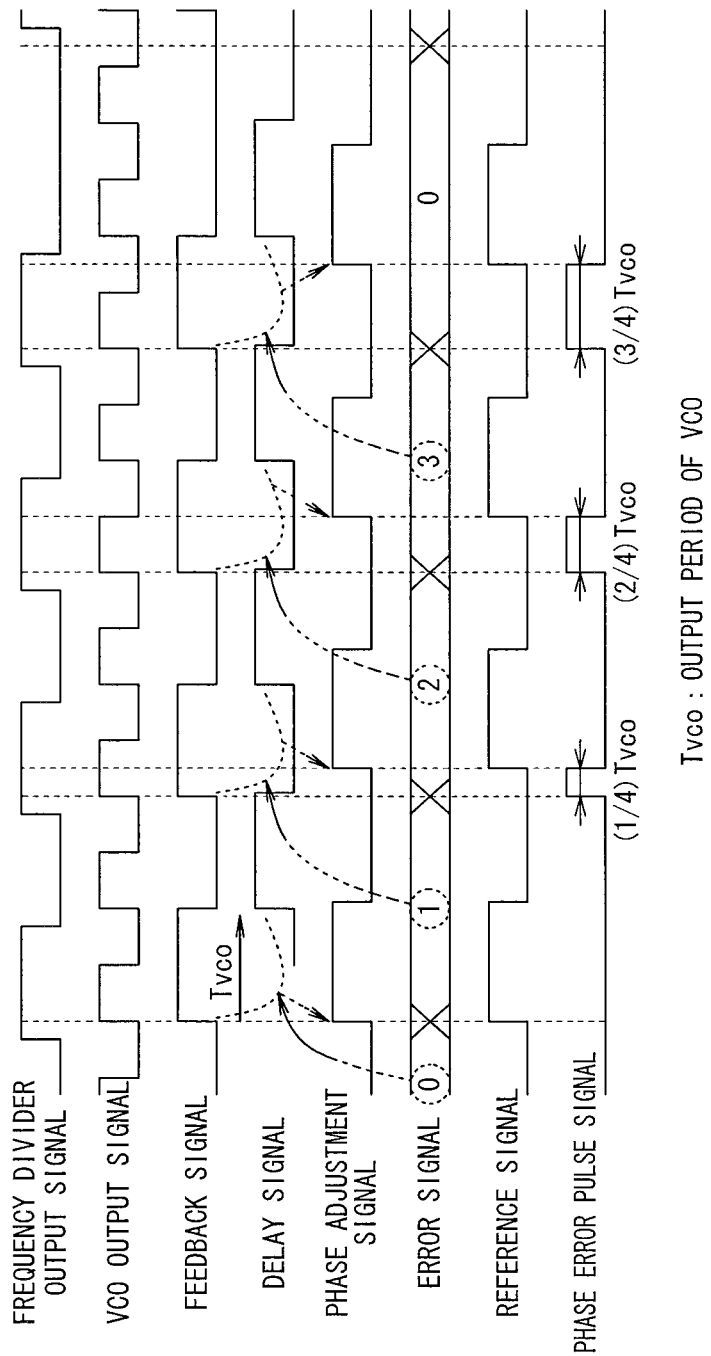
FIG. 14 is a timing chart illustrating each signal related to input and output of the fractional phase error pulse generation circuit in FIG. 6 in a case where the fractional frequency division set value is 9/4.

FIG. 14 is a timing chart illustrating each signal related to input and output of the fractional phase error pulse generation circuit 142 in FIG. 6 in the case where the fractional frequency division set value is 9/4.

The delay circuit 144 in the fractional phase error pulse generation circuit 142 generates the feedback signal to the frequency and phase detector 141 and the delay signal delayed by the oscillation period of the VCO 115 with respect to the feedback signal, based on the frequency divider output signal and the VCO output signal which are both input to the delay circuit 144.

The phase shift circuit 145 in the fractional phase error pulse generation circuit 142 generates the phase adjustment signal as the output of the phase shift circuit 145, by phase shifting between the rising edges of the feedback signal and the delay signal which are both input to the phase shift circuit 145. For example, in a case where the error signal from the accumulator 120 is 1/4 of a unit with one period of the output signal from the VCO 115 being as the unit, the rising edge of the phase adjustment signal is situated at a position of 1/4 between the rising edges of the feedback signal and the delay signal. In a case where the error signal is 2/4 thereof in the next step, the rising edge of the phase adjustment signal is situated at a center position between the rising edges of the feedback signal and the delay signal. The phase difference detection circuit 146 generates the phase error pulse signal whose pulse width corresponds to the phase difference between the rising edges of the feedback signal and the phase adjustment signal which are both input to the phase difference detection circuit 146.

As can be understood from the above description, the phase error pulse signal corresponding to the fractional phase error which occurs between the UPX signal and the DNX signal output from the frequency and phase detector 141 can be generated by the fractional phase error pulse generation circuit 142 illustrated in FIG. 6. Based on this phase error pulse signal, proper phase adjustment for correcting the fractional phase error can be carried out.

FIG. 15 is a block diagram illustrating another example of the fractional phase error pulse generation circuit 142 applied to the phase detector 140 in FIG. 4.

A fractional phase error pulse generation circuit 142a in FIG. 15 is formed by connecting a delay circuit 144a and the phase difference detection circuit 146, as illustrated. The fractional phase error pulse generation circuit 142a differs from the fractional phase error pulse generation circuit 142 in FIG. 6 described above in that the delay circuit 144a configured to receive the error signal from the accumulator 120 and a plurality of VCO output signals each delayed by an integer multiple of 1/M (M is a natural number) of the output period of the VCO 115 is applied, and that the phase shift circuit 145 is omitted. The delay circuit 144a generates the delay signal delayed by an integer multiple of 1/M (M is a natural number) of the output period of the VCO 115 with respect to the feedback signal output to the frequency and phase detector 141, based on the error signal from the accumulator 120. The phase difference detection circuit 146 generates the phase error pulse signal whose pulse width corresponds to the phase difference between the rising edges of the feedback signal and the delay signal which are both input to the phase difference detection circuit 146.

FIG. 16 is a block diagram illustrating a VCO for obtaining eight VCO output signals each delayed by an integer multiple of 1/8 of the output period of the VCO 115. In the example in FIG. 16, the VCO 115 constitutes a differential ring oscillator in which delay devices are consecutively cascade-connected in four stages. Eight VCO output signals VCOn (n=1 to 8) with high accuracy each delayed by an integer multiple of 1/8 of the output period of the VCO 115 can be easily obtained through the structure in FIG. 16.

Figure 17:
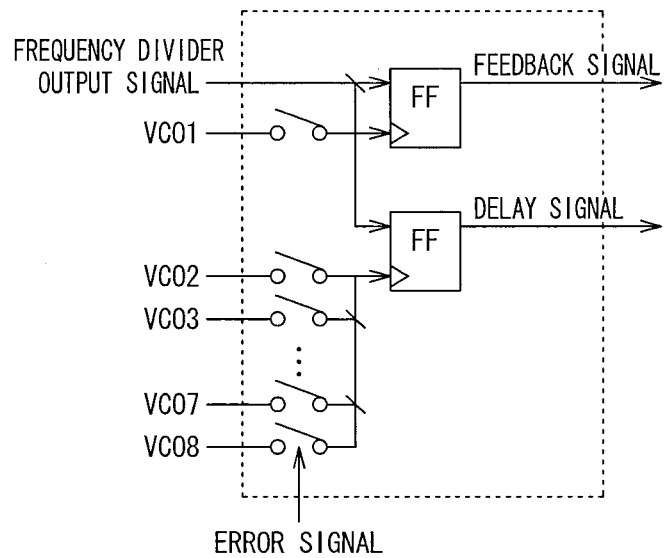
FIG. 17 is a circuit diagram illustrating a delay circuit applied to the fractional phase error pulse generation circuit in FIG. 15.

FIG. 17 is a circuit diagram illustrating the delay circuit 144a applied to the fractional phase error pulse generation circuit 142 in FIG. 15.

The delay circuit 144a in FIG. 17 is formed by connecting two flip-flops (FF) and switches as illustrated, and has a structure capable of such control that selectively turns on one of switches connected to VCOn (n=2 to 8) according to the error signal from the accumulator 120.

The delay circuit 144a and the fractional phase error pulse generation circuit 142a will be described below, with reference to FIGS. 16 and 17. In a case where only the switch connected to VCO2 is turned on according to the error signal from the accumulator 120, the delay signal delayed by 1/8 of the output period of the VCO 115 with respect to the feedback signal can be obtained. Likewise, in a case where only the switch connected to VCO3 is turned on, the delay signal delayed by 2/8 of the output period of the VCO 115 with respect to the feedback signal can be obtained.

As can be understood from above description, in the case where the fractional phase error is an integer multiple of 1/8 of the output period of the VCO 115, the delay signal delayed by the fractional phase error with respect to the feedback signal can be obtained by controlling the switches connected to VCOn (n=2 to 8) according to the error signal from the accumulator 120.

Following this, the phase error pulse signal equal to the fractional phase error can be generated by the phase difference detection circuit 146 generating the phase error pulse signal whose pulse width corresponds to the phase difference between the rising edges of the feedback signal and the delay signal which are both input to the phase difference detection circuit 146. Thus, this embodiment has a characteristic feature that the phase shift circuit 145 as illustrated in FIG. 6 is unnecessary and so the fractional phase error pulse generation circuit can be formed with a smaller number of elements.

The above description has been given to the case where the fractional phase error is an integer multiple of 1/8 of the output period of the VCO 115. Even in a case where the fractional phase error is not an integer multiple of 1/8 of the output period of the VCO 115, however, the delay amount may be selected so that both values are approximate to each other.

In such a case, it is impossible to completely eliminate the fractional spurious, but a practically sufficient fractional spurious reduction effect can still be achieved by increasing the number of stages of the VCO 115 to set a sufficiently fine step size of the delay amount.

Figure 18:
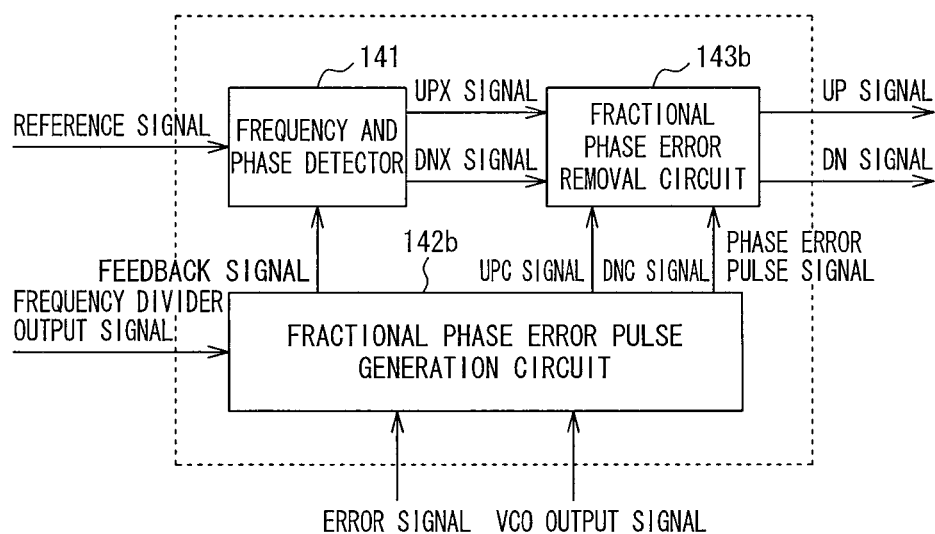
FIG. 18 is a block diagram illustrating a phase detector applied to the accumulator-type fractional N-PLL synthesizer in FIG. 1.

FIG. 18 is a circuit diagram illustrating another example of the phase detector 140 applied to the accumulator-type fractional N-PLL synthesizer 100 in FIG. 1.

A phase detector 140*b* in FIG. 18 is formed by connecting the frequency and phase detector 141, a fractional phase error pulse generation circuit 142*b*, and a fractional phase error removal circuit 143*b*, as illustrated.

The phase detector 140*b* is configured to correct and detect the phase difference between the frequency divider output signal supplied from the fractional frequency divider 112 (FIG. 1) as the feedback signal and a predetermined reference signal by reflecting the error signal supplied from the accumulator 120 and the output signal of the VCO 115 so as to reduce the fractional phase error. The structure and operation of the phase detector 140*b* will be described in more detail later with reference to drawings.

The fractional phase error pulse generation circuit 142*b* generates the feedback signal to the frequency and phase detector 141 and the phase error pulse signal (UPC signal, DNC signal) that is proportional to the fractional phase error and that is supplied to the fractional phase error removal circuit 143*b*, based on the frequency divider output signal from the fractional frequency divider 112, the VCO output signal from the VCO 115, and the error signal from the accumulator 120.

The frequency and phase detector 141 compares frequencies and phases between a predetermined reference signal and the feedback signal from the fractional phase error pulse generation circuit 142*b*, and generates the UPX signal and the DNX signal corresponding to differences as a result of comparison. The fractional phase error is included between the UPX signal and the DNX signal.

The fractional phase error removal circuit 143*b* controls the pulse widths of the UPX signal and the DNX signal including the fractional phase error from the frequency and phase detector 141 based on the phase error pulse signal (UPC signal, DNC signal) from the fractional phase error pulse generation circuit 142*b*, thereby obtaining the UP signal and the DN signal with the reduced fractional phase error. The fractional phase error removal circuit 143*b* supplies the obtained UP signal and DN signal to the charge pump 113 (FIG. 1).

Figure 19:
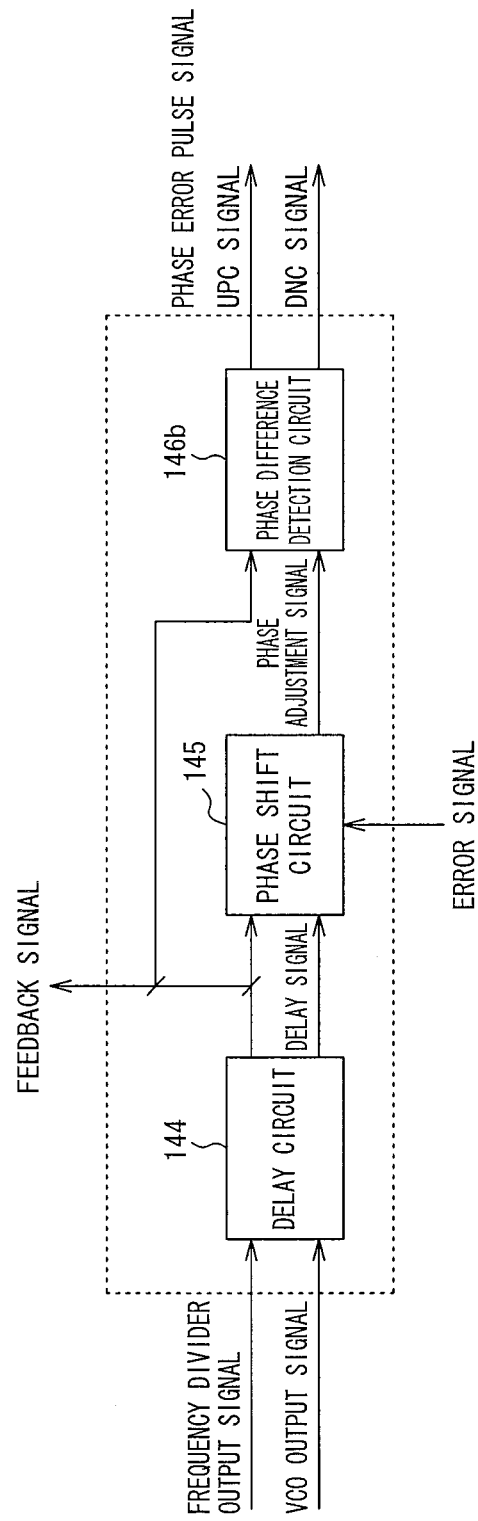
FIG. 19 is a block diagram illustrating an example of a fractional phase error pulse generation circuit applied to the phase detector in FIG. 18.

FIG. 19 is a block diagram illustrating another example of the fractional phase error pulse generation circuit 142*b* applied to the phase detector 140*b* in FIG. 18.

The fractional phase error pulse generation circuit 142*b* in FIG. 19 differs from the fractional phase error pulse generation circuit 142 in FIG. 6 described above in that there are two outputs (phase error pulse signals) from the phase difference detection circuit 146.

Figure 20:
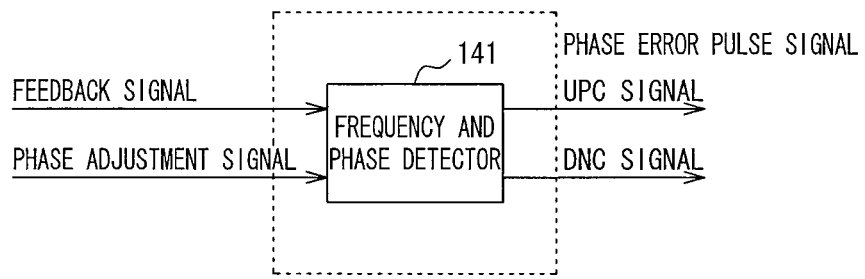
FIG. 20 is a block diagram illustrating a phase difference detection circuit applied to the fractional phase error pulse generation circuit in FIG. 19.

FIG. 20 is a block diagram illustrating the phase difference detection circuit 146*b* applied to the fractional phase error pulse generation circuit 142*b* in FIG. 19. The phase difference detection circuit 146*b* in FIG. 19 applies the frequency and phase detector 141 included in the phase detector 140 in FIG. 4, and uses both of the two outputs.

Figure 21:
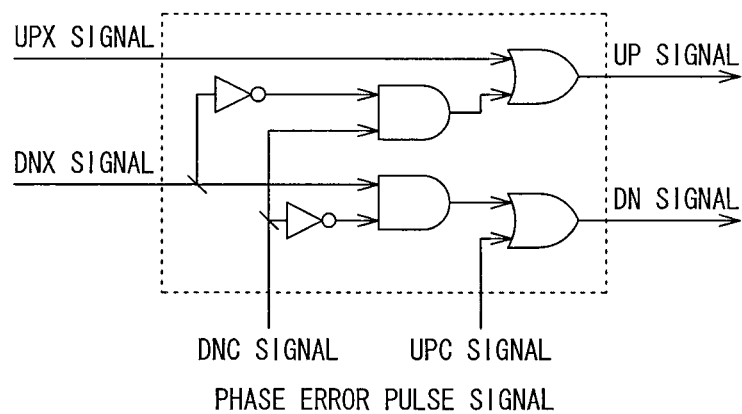
FIG. 21 is a circuit diagram illustrating an example of a fractional phase error removal circuit applied to the phase detector in FIG. 18.

FIG. 21 is a circuit diagram illustrating an example of the fractional phase error removal circuit 143*b* applied to the phase detector 140*b* in FIG. 18. The fractional phase error removal circuit 143*b* in FIG. 21 removes the fractional phase error occurring between the UPX signal and the DNX signal output from the frequency and phase detector 141 by a logical operation using the phase error pulse signal (UPC signal and DNC signal) from the fractional phase error pulse generation circuit 142*b*, and then outputs the results as the UP signal and the DN signal.

Note that the structure of the fractional phase error removal circuit 143 is not limited to those illustrated in FIGS. 12, 13, and 21.

Figure 22:
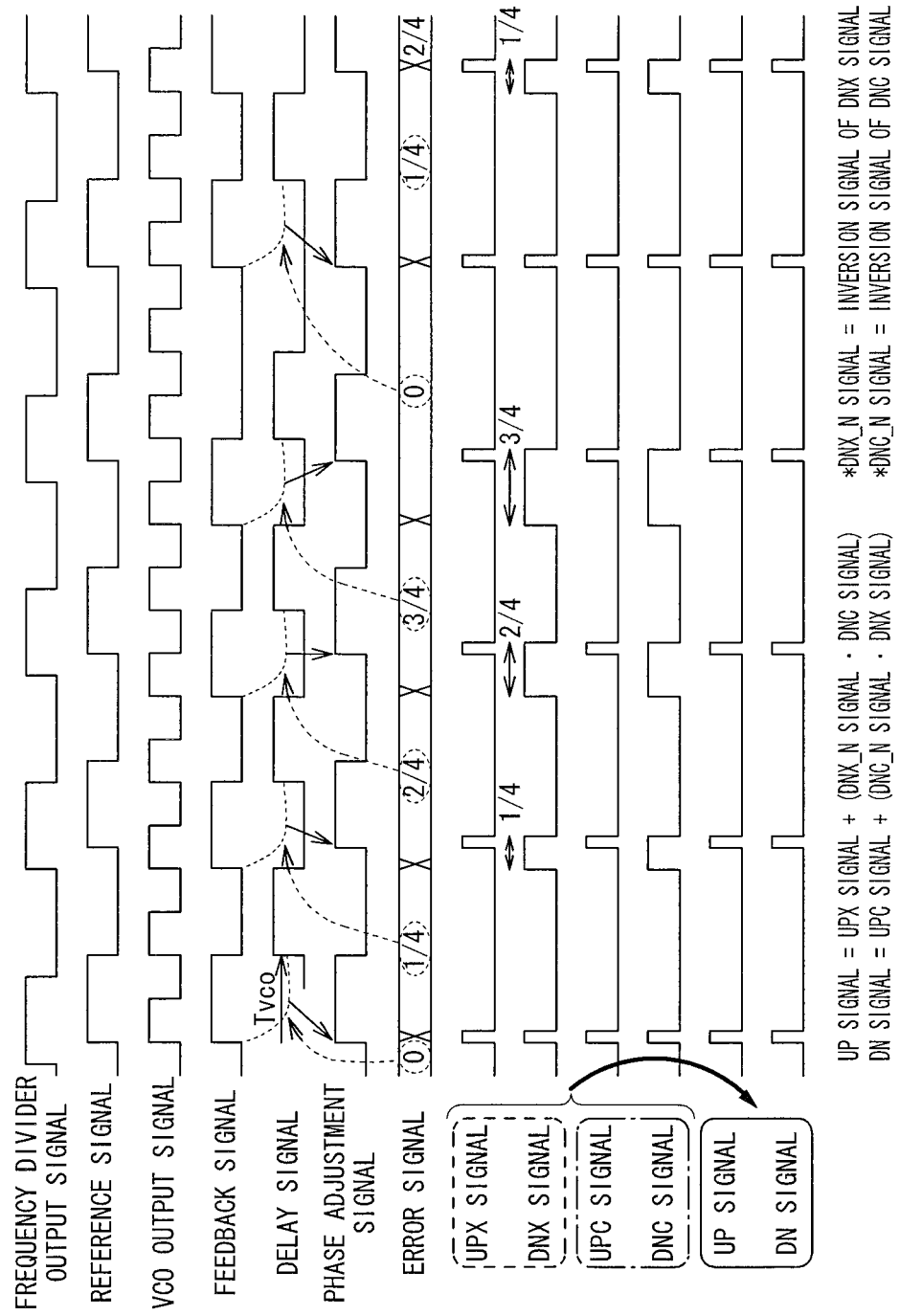
FIG. 22 is an exemplary timing chart illustrating each signal related to input and output of the phase detector in a case where the fractional frequency division set value is 9/4, in the accumulator-type fractional N-PLL synthesizer in FIG. 1.

FIG. 22 is a timing chart illustrating each signal related to input and output of the phase detector 140*b* in the case where the fractional frequency division is set to 9/4, when the phase detector 140*b* described above with reference to FIG. 18 is applied as the phase detector 140 in the accumulator-type fractional N-PLL synthesizer 100 in FIG. 1, and the fractional phase error pulse generation circuit 142*b* described above with reference to FIG. 19 and the fractional phase error removal circuit 143*b* described above with reference to FIG. 21 are applied, as the phase detector 140*b*.

The phase detector 140*b* in the accumulator-type fractional N-PLL synthesizer 100 in FIG. 1 will be further described below, with reference to FIG. 22.

As can be understood from FIG. 22, in the accumulator-type fractional N-PLL synthesizer 100, a periodic phase error (fractional phase error) occurs between the reference signal and the feedback signal, and then the fractional phase error appears between the two outputs (UPX signal and DNX signal) from the frequency and phase detector 141. This propagates to the LPF 114, thus causing the fractional spurious.

Accordingly, the fractional phase error pulse generation circuit 142*b* described above with reference to FIG. 19 generates the UPC signal and the DNC signal proportional to the fractional phase error. The following logical operation UP signal=*UPX* signal+(*DNX_N* signal·*DNC* signal)

DN signal=*UPC* signal+(*DNC_N* signal·*DNX* signal)

is then performed to remove the fractional phase error occurring between the UPX signal and the DNX signal using the UPC signal and the DNC signal, and output the UP signal and the DN signal corresponding to the phase difference between the reference signal and the feedback signal (phase adjustment signal), where the DNX_N signal=an inversion signal of the DNX signal and the DNC_N signal=an inversion signal of the DNC signal.

As can be understood from above description, the technique described with reference to FIGS. 1 to 22 can be conceived as a technical concept for a control method of an accumulator-type fractional N-PLL synthesizer for controlling the phase detector to generate the UP signal and the DN signal with the fractional phase error which occurs between the reference signal and the frequency divider output signal being reduced based on the error signal from the accumulator.

The scope of the present invention is not limited to the illustrative embodiments described and depicted herein, and includes all embodiments which produce equivalent advantageous effects as intended by the present invention. Moreover, the scope of the present invention is not limited to the combination of the features of the invention defined by claim 1, and can be defined by any desired combination of specific features out of all disclosed features.

Reference Signs List
- 100 accumulator-type fractional N-PLL synthesizer
- 112, 1712, 1812 fractional frequency divider
- 113, 1713, 1813 charge pump 114, 1714, 1814 LPF
115, 1715, 1815 VCO
120, 1720, 1820 accumulator
121 adder
122 saturation processing circuit
140, 140b, 1711, 1811 phase detector
141, 141a frequency and phase detector
142, 142a, 142b fractional phase error pulse generation circuit
143, 143b fractional phase error removal circuit
144, 144a delay circuit
145 phase shift circuit
146, 146b phase difference detection circuit
147a, 147b transconductance amplifier
148 comparator
1700 typical delta-sigma-type fractional N-PLL synthesizer
1800 conventional accumulator-type fractional N-PLL synthesizer

The invention claimed is:

1. An accumulator-type fractional N-PLL synthesizer comprising:
   a voltage-controlled oscillator (VCO);
   a fractional frequency divider, disposed in a feedback path of an output signal of the VCO, for generating a frequency divider output signal of a fractional frequency division number;
   an accumulator for supplying an overflow signal for periodically switching a frequency division number of the fractional frequency division number, to the fractional frequency divider; and
   a phase detector for detecting a phase difference between the frequency divider output signal and a predetermined reference signal to generate a control input signal to the VCO based on the detected phase difference,
   wherein the accumulator generates an error signal having fractional phase error information,
   wherein the phase detector receives the error signal and the output signal of the VCO, and corrects the phase difference between the frequency divider output signal and the reference signal, using the error signal and the output signal of the VCO, and
   wherein the phase detector includes:
      a fractional phase error pulse generation circuit for generating a phase error pulse signal having a pulse width proportional to a fractional phase error and generating a feedback signal, based on the frequency divider output signal and the error signal,
      a frequency and phase detector for generating a frequency and phase detection output signal having a pulse width proportional to a difference in frequency and phase between the reference signal and the feedback signal, and
      a fractional phase error removal circuit for generating an UP signal and a DN signal with the fractional phase error included in the frequency and phase detection output signal being reduced, based on the phase error pulse signal.

2. The accumulator-type fractional N-PLL synthesizer according to claim 1, wherein the phase detector generates the phase difference as the UP signal and the DN signal, and supplies the generated UP signal and DN signal to a charge pump for generating the control input signal.

3. The accumulator-type fractional N-PLL synthesizer according to claim 1, wherein the fractional phase error removal circuit includes a logical circuit for taking a logical sum of the frequency and phase detection output signal and the phase error pulse signal.

4. The accumulator-type fractional N-PLL synthesizer according to claim 1, wherein the fractional phase error removal circuit includes a logical circuit including a NOT circuit and a NOR circuit for removing the fractional phase error included in the frequency and phase detection output signal using the phase error pulse signal.

5. The accumulator-type fractional N-PLL synthesizer according to claim 1, wherein the fractional phase error removal circuit removes the fractional phase error occurring between two output signals which are a UPX signal and a DNX signal included in the frequency and phase detection output signal, by performing logical operations of
   UP signal=UPX signal+(DNX_N signal·DNC signal), and
   DN signal=UPC signal+(DNC_N signal·DNX signal),
      using the phase error pulse signal including a UPC signal and a DNC signal, where the DNX_N signal is an inversion signal of the DNX signal, and the DNC_N signal is an inversion signal of the DNC signal.

6. The accumulator-type fractional N-PLL synthesizer according to claim 1, wherein the fractional phase error pulse generation circuit includes:
   a delay circuit for generating the feedback signal and a delay signal having a predetermined time delay with respect to the feedback signal, based on the frequency divider output signal;
   a phase shift circuit for generating a phase adjustment signal based on the feedback signal, the delay signal, and the error signal; and
   a phase difference detection circuit for generating the phase error pulse signal having a pulse width proportional to a phase difference between the feedback signal and the phase adjustment signal.

7. The accumulator-type fractional N-PLL synthesizer according to claim 1, wherein the fractional phase error pulse generation circuit includes:
   a delay circuit for generating the feedback signal and a delay signal having a predetermined time delay with respect to the feedback signal, based on the frequency divider output signal;
   a phase shift circuit for generating a phase adjustment signal based on the feedback signal, the delay signal, and the error signal; and
   a phase difference detection circuit for generating a UPC signal and a DNC signal as the phase error pulse signal having a pulse width proportional to a phase difference between the feedback signal and the phase adjustment signal.

8. The accumulator-type fractional N-PLL synthesizer according to claim 6, wherein the delay circuit generates the feedback signal and the delay signal to be delayed by a period of the output signal with respect to the feedback signal, based on an input signal to the delay circuit.

9. The accumulator-type fractional N-PLL synthesizer according to claim 6, wherein the phase shift circuit is supplied with the feedback signal and the delay signal, and generates the phase adjustment signal by performing phase shift on the feedback signal based on the error signal.

10. The accumulator-type fractional N-PLL synthesizer according to claim 1, wherein the fractional phase error pulse generation circuit includes:
   a delay circuit for generating a delay signal delayed by an integer multiple of 1/M of an output period of the VCO with respect to the feedback signal where M is a natural number, based on the error signal; and a phase difference detection circuit for generating the phase error pulse signal having a pulse width proportional to a phase difference between the feedback signal and the delay signal.

11. The accumulator-type fractional N-PLL synthesizer according to claim 10, wherein the delay circuit selects one signal out of the frequency divider output signal and a plurality of signals each delayed by an integer multiple of 1/M of an output period of the VCO where M is a natural number, based on the error signal.

12. The accumulator-type fractional N-PLL synthesizer according to claim 1, wherein the error signal is a signal that gradually changes in each period of the overflow signal.

13. An accumulator-type fractional N-PLL synthesizer comprising:
   an accumulator; and
   a phase detector for generating an UP signal and a DN signal with a fractional phase error which occurs between a reference signal and a frequency divider output signal being reduced based on an error signal from the accumulator and an output signal from a voltage-controlled oscillator (VCO),
   wherein the phase detector includes:
      a fractional phase error pulse generation circuit for generating a phase error pulse signal having a pulse width proportional to the fractional phase error and generating a feedback signal, based on the frequency divider output signal and the error signal having information on the fractional phase error,
      a frequency and phase detector for generating a frequency and phase detection output signal having a pulse width proportional to a difference in frequency and phase between the reference signal and the feedback signal, and
      a fractional phase error removal circuit for generating the UP signal and the DN signal with the fractional phase error included in the frequency and phase detection output signal being reduced, based on the phase error pulse signal.

14. A control method of an accumulator-type fractional N-PLL synthesizer, the method comprising:
   controlling a phase detector to generate a UP signal and a DN signal with a fractional phase error which occurs between a reference signal and a frequency divider output signal being reduced based on an error signal from an accumulator and an output signal from a voltage-controlled oscillator (VCO),
   wherein the controlling the phase detector includes:
      generating a phase error pulse signal having a pulse width proportional to the fractional phase error and generating a feedback signal, based on the frequency divider output signal and an error signal having information on the fractional phase error;
      generating a frequency and phase detection output signal having a pulse width proportional to a difference in frequency and phase between the reference signal and the feedback signal; and
      generating the UP signal and the DN signal with the fractional phase error included in the frequency and phase detection output signal being reduced, based on the phase error pulse signal.

15. The accumulator-type fractional N-PLL synthesizer according to claim 7, wherein the delay circuit generates the feedback signal and the delay signal to be delayed by a period of the output signal with respect to the feedback signal, based on an input signal to the delay circuit.

16. The accumulator-type fractional N-PLL synthesizer according to claim 7, wherein the phase shift circuit is supplied with the feedback signal and the delay signal, and generates the phase adjustment signal by performing phase shift on the feedback signal based on the error signal.

17. The accumulator-type fractional N-PLL synthesizer according to claim 1, wherein:
   the feedback signal is based on the frequency divider output signal; and
   the fractional phase error removal circuit is further for receiving the frequency and phase detection output signal, and for generating the UP signal and the DN signal, based on the frequency divider output signal, the error signal, and the output signal from the VCO.

* * * * *